(12) United States Patent
Foong et al.

(10) Patent No.: US 10,018,653 B2
(45) Date of Patent: Jul. 10, 2018

(54) KELVIN CONTACT ASSEMBLY IN A TESTING APPARATUS FOR INTEGRATED CIRCUITS

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 0 days.

(21) Appl. No.: 15/422,690

(22) Filed: Feb. 2, 2017

(65) Prior Publication Data

US 2017/0219624 A1    Aug. 3, 2017

(30) Foreign Application Priority Data

Feb. 2, 2016 (MY) .......................... PI 2016000188

(51) Int. Cl.
| | |
|---|---|
| *G01R 31/20* | (2006.01) |
| *G01R 1/067* | (2006.01) |
| *G01R 1/073* | (2006.01) |
| *G01R 31/28* | (2006.01) |
| *H01R 3/00* | (2006.01) |
| *H01R 101/00* | (2006.01) |
| *B29C 31/00* | (2006.01) |

(52) U.S. Cl.
CPC ..... *G01R 1/06727* (2013.01); *G01R 1/06722* (2013.01); *G01R 1/07357* (2013.01); *G01R 31/2886* (2013.01); *B29C 31/00* (2013.01); *H01R 3/00* (2013.01); *H01R 2101/00* (2013.01)

(58) Field of Classification Search
CPC .. B29C 31/00; B60R 1/00; H01R 3/00; H01R 2101/00
See application file for complete search history.

(56) References Cited

U.S. PATENT DOCUMENTS

| | | | | |
|---|---|---|---|---|
| 4,878,863 | A * | 11/1989 | Swengel, Jr. .......... | H01R 13/24 439/884 |
| 2001/0004556 | A1* | 6/2001 | Zhou .................. | G01R 1/06711 439/66 |
| 2002/0179904 | A1* | 12/2002 | Zhou .................. | G01R 1/06733 257/48 |
| 2005/0020136 | A1* | 1/2005 | Johannes ........... | H01R 13/6625 439/620.07 |

(Continued)

*Primary Examiner* — Jermele M Hollington
*Assistant Examiner* — Temilade Rhodes-Vivour
(74) *Attorney, Agent, or Firm* — Maschoff Brennan

(57) ABSTRACT

An electrical Kelvin contact assembly for testing IC testing apparatus that uses an assembly design that reduces the tolerance to a near negligible range. The assembly does not use any screws, dowel pins, adhesives or welding to fasten the electrical contacts to the housing. The design of the assembly uses rows of contacts with specially designed protrusions that sit snugly in openings located on three plate-like layers. These layers contain the contacts in the horizontal plane by securing the protrusions in the opening, as well as in the vertical plane by means of a sandwich between three separate layers. A second contact is slid into back slits formed by the three layers.

10 Claims, 10 Drawing Sheets

(56) References Cited

U.S. PATENT DOCUMENTS

| | | | |
|---|---|---|---|
| 2007/0200572 A1* | 8/2007 | Breton | G01R 1/07378 324/754.03 |
| 2008/0274654 A1* | 11/2008 | Yasumura | H01R 13/2407 439/862 |
| 2013/0249583 A1* | 9/2013 | Kuong | G01R 1/067 324/755.04 |

* cited by examiner

KELVIN CONTACT ASSEMBLY IN A TESTING APPARATUS FOR INTEGRATED CIRCUITS

FIELD OF INVENTION

The present invention relates generally to contact assemblies, and more specifically to kelvin contact assemblies in an integrated circuit testing apparatus.

BACKGROUND OF INVENTION

Integrated circuit (IC) testing apparatuses aimed at Kelvin contact testing typically use cantilever type contact, where one of the contacts is formed as a cantilever, and part assembly types, where both contacts are assembled over an electrical insulator. With both these types, there is a long wiping action on the pad/lead of the chip. With the part assembly type, the width of the housing partition wall is very thin, thus making it structurally weak and prone to breakage. Also with the part assembly type, accumulated tolerances are high, making assembly for fine pitching difficult.

With the ever smaller contact pads of the latest IC chips, such as wettable flank and dimple pads, Kelvin contact type testing is getting more challenging. One of the biggest problems is the tolerances accumulated throughout the testing apparatus using today's manufacturing methods. Manufacturing processes that involve contact based (cutting tool) processing often lead to accumulated tolerances that are the sum of the machine capability, method, tooling etc. Upper and lower tolerances on the component level create stack up issues that influence the final assembly. End result is a large overall tolerance that can lead to various test failures that result in more downtime.

What is needed is an improved IC chip testing solution that overcomes the above problems for a Kelvin testing solution as well as for multi-row chip testing.

SUMMARY OF INVENTION

The present invention seeks to overcome the aforementioned disadvantages by providing an electrical Kelvin contact assembly for testing IC testing apparatus that uses an assembly design that reduces the tolerance to a near negligible range. A sub-assembly that is part of the assembly does not use any screws, adhesives or welding to fasten the electrical contacts to the housing. The innovation is in the design of the assembly, which uses rows of contacts with specially designed protrusions that sit snugly in openings located on plate-like layers. These plate-like layers contain the contacts in the horizontal plane by securing the protrusions in the opening, as well as in the vertical plane by means of a sandwich between three separate layers. The first, base layer contains openings and slits which secure the bottom part of a front contact via matching protrusions in the front contact. A separator sits in between that base layer and a top layer. The top layer further secures the front contact with openings adapted to receive matching protrusions in the upper part of the front contact. A second contact called the back contact is slid into back slits formed by the three layers. Finally, four of these sub-assemblies are further secured in between a bottom cover, housing, and top cover to form the complete assembly. Dowel pins are only used to align the entire assembly so that all layers are aligned.

This design provides negligible accumulated or overall tolerances, allowing extremely precise probing of the electrical contacts to the IC pads. This results in less friction and wear, and ultimately less debris around the contact which causes short circuits and therefore less downtime.

This invention thus relates to an electrical contact sub-assembly for use in an integrated circuit testing apparatus, comprising: a plurality of front cantilever spring contacts, each front contact having a lower arm, an upper arm and a vertical back connecting said lower and upper arms, a rear bracket connected to said vertical back, said rear bracket having a vertical lower insert and a vertical upper insert; a plurality of back cantilever spring contacts, each back contact having a lower arm, an upper arm and a vertical back having a vertical lower insert and a vertical upper insert extending from said vertical back of said contact; a plate-like base layer having a plurality of front elongated protrusions and back protrusions, said front elongated protrusions and back protrusions thus forming front and back slits, respectively, and a row of openings on said base layer, each said opening located between a corresponding said front and back slit, and each said opening adapted to receive each said vertical lower insert of said front contact snugly, and each said front slit adapted to receive said lower arm of said front contact; a plate-like separator layer having a plurality of front elongated protrusions and back protrusions, said front elongated protrusions and back protrusions thus forming front and back slits, respectively, and said front elongated and back protrusions aligned with and corresponding to said front elongated and back protrusions of said base layer; a plate-like top layer having a plurality of front elongated protrusions and back protrusions, said front elongated protrusions and back protrusions thus forming front and back slits, respectively, and a row of openings on said top layer, each said opening located between a corresponding said front and back slit, and said front elongated and back protrusions aligned with and corresponding to said front elongated and back protrusions of said base layer, each said opening adapted to receive each said vertical upper insert of said front contact snugly, and each said front slit adapted to receive said upper arm of said front contact; whereby each said front contact is assembled onto said base layer by guiding each said vertical lower insert into each said opening so that a plurality of said front contacts is assembled in a row on said base layer, and the said separator is placed on top of said base layer, and the said top layer is placed on top of the said separator by guiding each said opening into each said corresponding vertical upper insert, thus locking the said row of front contacts in place, and sliding each said back contact from a rear side of the sub-assembly so that each said vertical back is received by a corresponding said back slit of the base layer, separator, and top layer. The said base layer, separator and top layer each is provided with a pair of openings, one near each end, and each opening aligned across the three said layers. The said base layer, separator and top layer are constructed from an electrically non-conductive material, and the said front and back cantilever spring contacts are constructed from an electrically conductive material.

This invention also relates to an electrical contact assembly for use in an integrated circuit testing apparatus, comprising: a plurality of front cantilever spring contacts, each front contact having a lower arm, an upper arm and a vertical back connecting said lower and upper arms, a rear bracket connected to said vertical back, said rear bracket having a vertical lower insert and a vertical upper insert; a plurality of back cantilever spring contacts, each back contact having a lower arm, an upper arm and a vertical back having a vertical lower insert and a vertical upper insert extending from said vertical back of said contact; four plate-like base layers, each having a plurality of front elongated protrusions and back protrusions, said front elongated protrusions and back protrusions thus forming front and back slits, respectively, and a row of openings on said base layer, each said opening located between a corresponding said front and back slit, and each said opening adapted to receive each said vertical lower insert of said front cantilever spring contact snugly, and each said front slit adapted to receive said lower arm of said front cantilever contact, each said base layer is provided with a pair of through holes, one near each end; four plate-like separator layers, each having a plurality of front elongated protrusions and back protrusions, said front elongated protrusions and back protrusions thus forming front and back slits, respectively, and said front elongated and back protrusions aligned with and corresponding to said front elongated and back protrusions of said base layer, each said separator is provided with a pair of through holes, one near each end, and aligned with said through holes on the base layer; four plate-like top layers, each having a plurality of front elongated protrusions and back protrusions, said front elongated protrusions and back protrusions thus forming front and back slits, respectively, and a row of openings on said top layer, each said opening located between a corresponding said front and back slit, and said front elongated and back protrusions aligned with and corresponding to said front elongated and back protrusions of said base layer, each said opening adapted to receive each said vertical upper insert of said front cantilever spring contact snugly, and each said front slit adapted to receive said upper arm of said front cantilever contact, each said top layer is provided with a pair of through holes, one near each end, and aligned with said through holes on the base layer; a plate-like bottom cover having through holes that align with said pair of through holes on said bottom layers, separators and top layers, and a plurality of openings each adapted to receive one said vertical lower insert of the back contact, and a plurality of openings to allow said lower arm of front contact and lower arm of back contact to peek through; a plate-like top cover having through holes that align with said pair of through holes on said bottom layers, separators and top layers, and a plurality of openings each adapted to receive one said vertical upper insert of the back contact, and a plurality of openings to allow said upper arm of front contact and upper arm of back contact to peek through; a housing adapted to receive said bottom cover, base layers, separators, top layers, and top cover; a plurality of dowel pins for inserting through said through holes of said bottom cover, base layers, separators, top layers, and top cover, so that they are aligned with each other; whereby each said front contact is assembled onto each said base layer by guiding each said vertical lower insert into each said opening so that a plurality of said front cantilever spring contacts or assembled in a row on said base layer, and each said separator is placed on top of said base layer, and each said top layer is placed on top of the said separator by guiding each said opening into each said corresponding vertical upper insert, thus locking the said row of front contacts in place, sliding each said back contact from a rear side of the sub-assembly so that each said vertical back is received by a corresponding said back slit of the base layer, separator, and top layer, thus forming a sub-assembly, and four of these said sub-assemblies are placed to form a square pattern on said bottom cover, said housing is placed above said bottom cover and sub-assemblies, said top cover is placed above said housing with said dowel pins inserted into said through holes to secure the sub-assemblies in alignment. The said base layer, separator and top layer are constructed from an electrically non-conductive material, and the said front and back cantilever spring contacts are constructed from an electrically conductive material.

In a preferred embodiment, the top arms of both the front and back contacts are fashioned in an arc along its length that is substantially horizontal. This arc, along with the vertical upper tips, produce a very short wipe stroke of the contact against the IC pad being tested. This results in less friction and wear, and ultimately less debris around the contact which causes short circuits and therefore less downtime.

In a preferred embodiment, the upper arm of the front contact extends to an almost vertical upper tip. This upper tip has an angle of between 7° and 8° to the vertical. This range provides the shortest wiping stroke.

Other objects and advantages will be more fully apparent from the following disclosure and appended claims.

DETAILED DESCRIPTION OF INVENTION

Figure 1A:
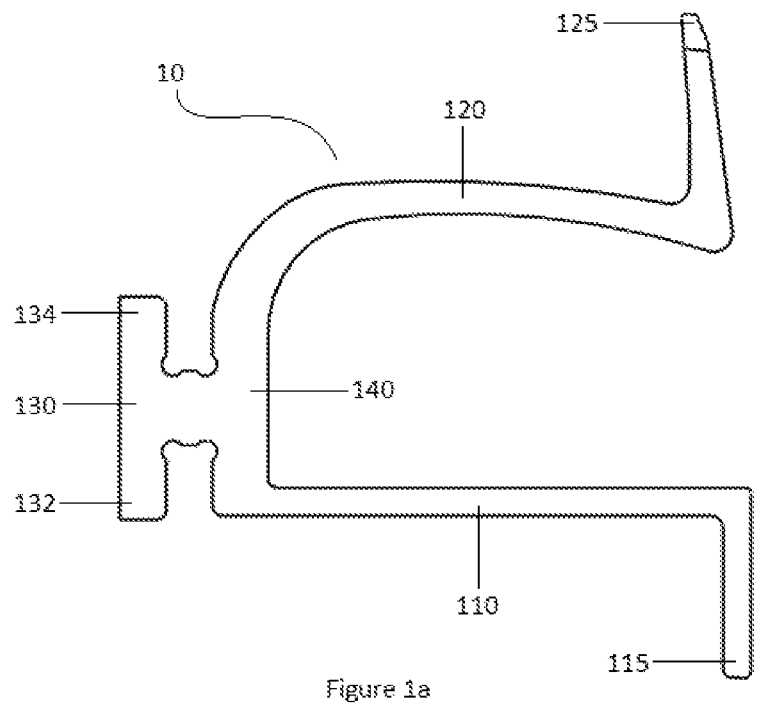
FIGS. 1a, 1b and 1c show views of a front cantilever spring contact in an embodiment of this invention

It should be noted that the following detailed description is directed to an electrical contact assembly of an integrated circuit (IC) testing apparatus, and is not limited to any particular size or configuration but in fact a multitude of sizes and configurations within the general scope of the following description.

LIST OF NUMBERED ELEMENTS IN FIGURES

Sub-assembly (5)
Front cantilever spring contact (10)
Lower arm (110)
Lower tip (115)
Upper arm (120)
Upper tip (125)
Rear bracket (130)
Vertical lower insert (132)
Vertical upper insert (134)
Vertical back (140)
Back cantilever spring contact (20)
Lower arm (210)
Lower tip (215)
Upper arm (220)
Upper tip (225)
Vertical back (240)
Vertical lower insert (242)

Vertical upper insert (244)
Base layer (30)
Front elongated protrusions (310)
Back protrusions (320)
Openings (330)
Separator layer (40)
Front elongated protrusions (410)
Back protrusions (420)
Top layer (50)
Front elongated protrusions (510)
Back protrusions (520)
Openings (530)
Bottom cover (60)
Top cover (70)
Housing (80)

Figure 1B:
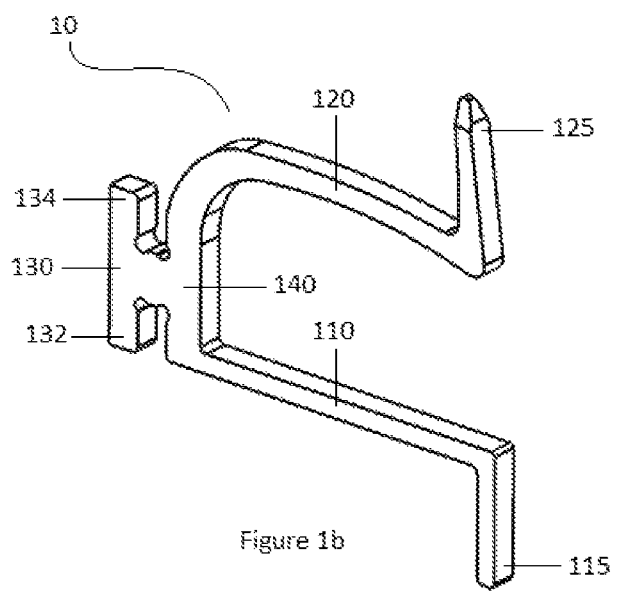
Figure 1C:
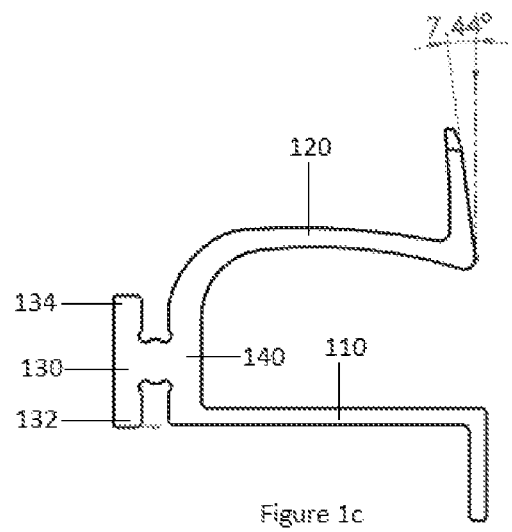

Referring to FIGS. 1a through 1c, there is shown a front cantilever spring contact (10) in an embodiment of the present invention. This front contact (10) has a C-shape design and is comprised of a lower arm (110), joined at a rear end to a lower end of a vertical back (140), an upper arm (120) joined at one end to an upper end of said vertical back (140). The lower arm (110) is substantially horizontal from the connection with the vertical back (140) until a point, at which it deviates 90° downwards, towards a lower tip (115) that forms the contact point with a contact pad to be tested. Likewise, the upper arm (120) is curved mostly in a horizontal plane from the connection with the vertical back (140) until a point, at which it deviates 90° upwards, towards an upper tip (125) that forms the contact point with a contact pad to be tested. From an interim point of the vertical back (140) protrudes a rear bracket (130), which is parallel to said vertical back (140). The rear bracket (130) is a vertical column having a lower end that is a vertical lower insert (132) and an upper end that is a vertical upper insert (134).

FIG. 1c in particular shows that the preferred angle of the upper tip (125) against the vertical is around 7.44°, and between 7° and 8°.

Figure 2A:
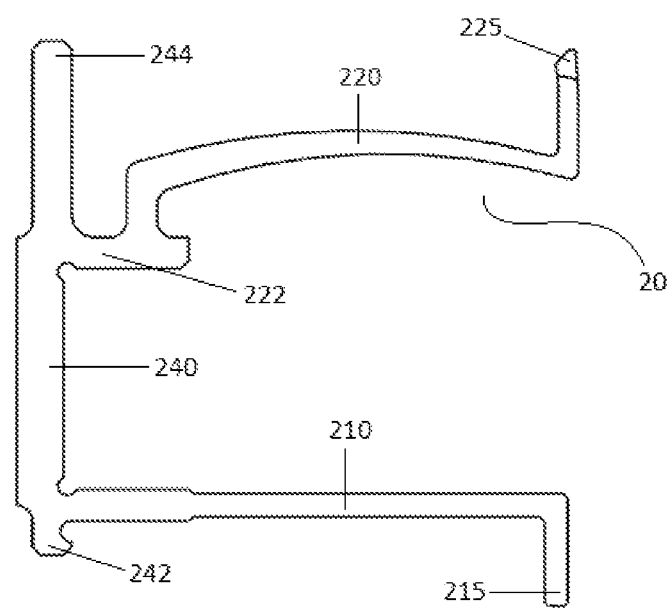
FIGS. 2a and 2b show views of a back cantilever spring contact in an embodiment of this invention
Figure 2B:
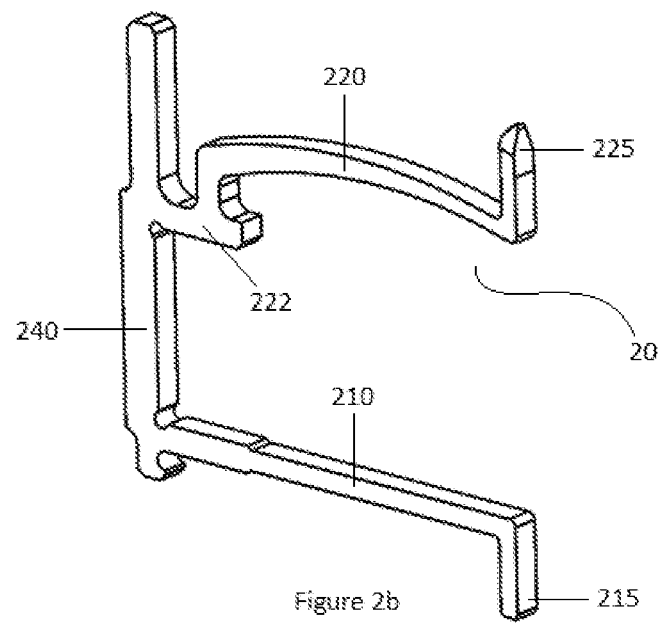

Referring to FIGS. 2a and 2b, there is shown a back cantilever spring contact (20) in an embodiment of the present invention. This back contact (20) has a C-shape design and is comprised of a lower arm (210), joined at a rear end to a lower end of a vertical back (240), an upper arm (220) joined at one end to an upper end of said vertical back (240). The lower arm (210) is substantially horizontal from the connection with the vertical back (240) until a point, at which it deviates 90° downwards, towards a lower tip (215) that forms the contact point with a contact pad to be tested. The upper arm (220) extends from a point on said vertical back (240) forwards along a horizontal member (222) until a point, where it deviates 90° upwards, and then deviates again 90° forwards. This upper arm (220) then continues curved mostly in a horizontal plane until a point, at which it deviates 90° upwards, towards an upper tip (225) that forms the contact point with a contact pad to be tested. The reason for this meandering of the upper arm is to allow an arcing of the upper arm (220) whilst maintain the horizontal member (222) in a substantially horizontal direction, so that a bottom side of it is substantially in a horizontal plane. In this way, the horizontal member (222), vertical back (240) and a rear portion of the lower arm (210) form a C shape with 90° angles which, via a plurality of these back contacts (20), is used to lock a sub-assembly of the front contact (10), a base layer, a separator layer, and a top layer described below.

The vertical back (240), from the connection with the upper arm (220), extends upwards to form a vertical upper insert (244). The vertical back (240), from the connection with the lower arm (210), extends downwards to form a vertical lower insert (242).

The upper arms (120, 220) of the front (10) and back (20) contacts are fashioned in an arc along its length that is substantially horizontal. This arc, along with the vertical upper tips, produce a very short wipe stroke of the contact against the IC pad being tested. This results in less friction and wear, and ultimately less debris around the contact which causes short circuits and therefore less downtime.

Figure 3A:
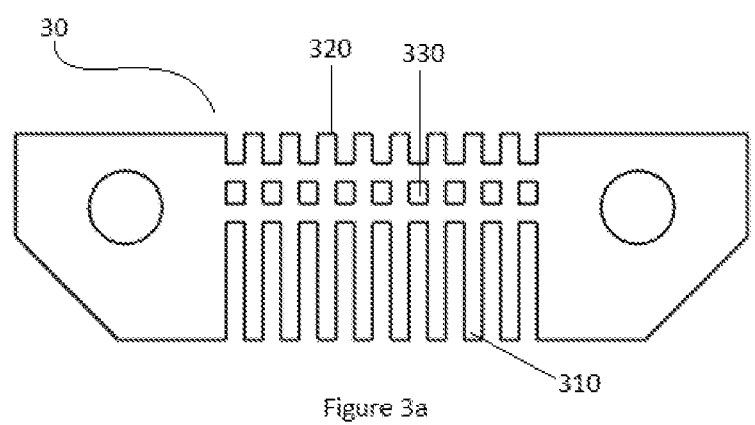
FIGS. 3a and 3b show views of a base layer in an embodiment of this invention
Figure 3B:
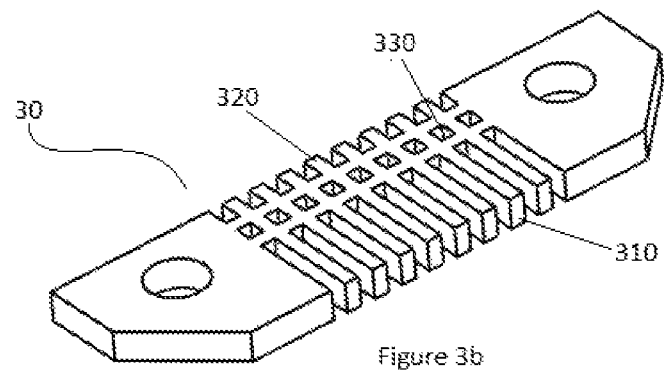

Referring to FIGS. 3a and 3b, there is shown a base layer (30). This base layer (30) is an oblong, plate-like member with a machined row of front elongated protrusions (310) towards a front end, and back protrusions (320) at a rear end. The rows of front elongated protrusions (310) and back protrusions (320) form front and back slits, respectively. A row of openings (330), each opening located between a corresponding said front and back slit, is adapted to receive each said vertical lower insert (132) of said front contact (10) snugly, and each said front slit adapted to receive said lower arm (110) of said front contact snugly. This base layer (30) is constructed of an electrically non-conductive material.

Figure 4A:
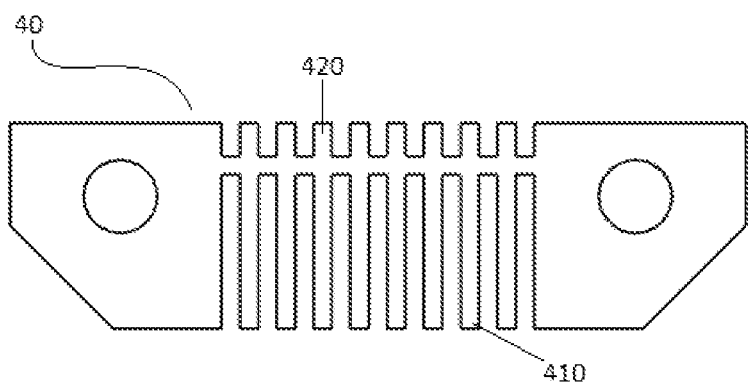
FIGS. 4a and 4b show views of a separator layer in an embodiment of this invention
Figure 4B:
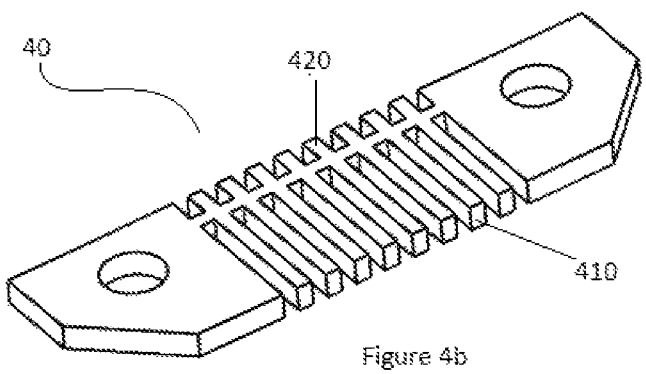

Referring to FIGS. 4a and 4b, there is shown a separator layer (40). This separator layer 40) is an oblong, plate-like member with a machined row of front elongated protrusions (410) towards a front end, and back protrusions (420) at a rear end. The rows of front elongated protrusions (410) and back protrusions (420) form front and back slits, respectively. In assembly, the said front elongated (410) and back (420) protrusions are aligned with and corresponding to said front elongated (310) and back (320) protrusions of said base layer (30), respectively. This separator layer (40) is constructed of an electrically non-conductive material.

Figure 5A:
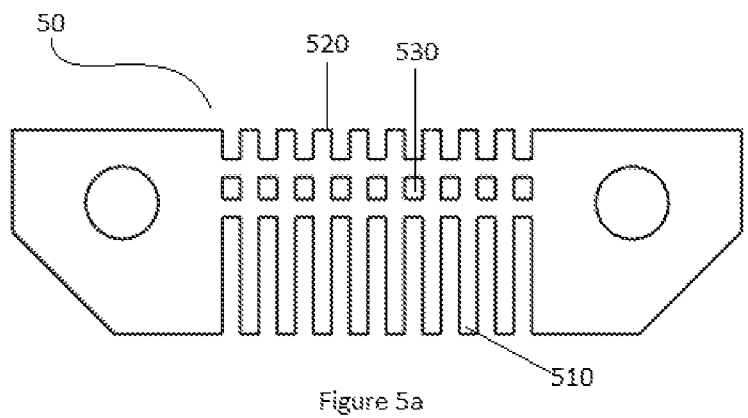
FIGS. 5a and 5b show views of a top layer in an embodiment of this invention
Figure 5B:
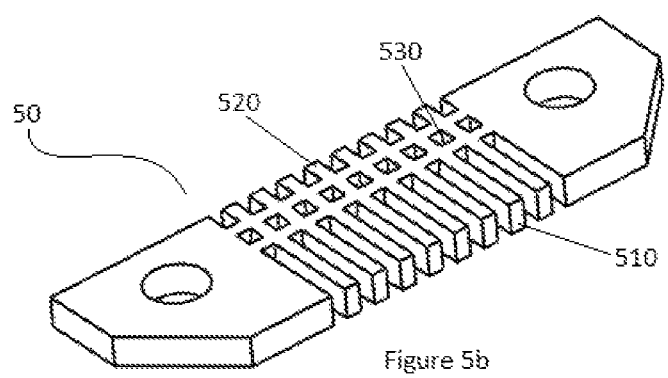

Referring to FIGS. 5a and 5b, there is shown a top layer (50). This top layer (50) is an oblong, plate-like member with a machined row of front elongated protrusions (510) towards a front end, and back protrusions (520) at a rear end. The rows of front elongated protrusions (510) and back protrusions (520) form front and back slits, respectively. A row of openings (530), each opening located between a corresponding said front and back slit, is adapted to receive each said vertical upper insert (134) of said front contact (10) snugly, and each said front slit adapted to receive said upper arm (120) of said front contact snugly. This top layer (50) is constructed of an electrically non-conductive material.

Figure 6A:
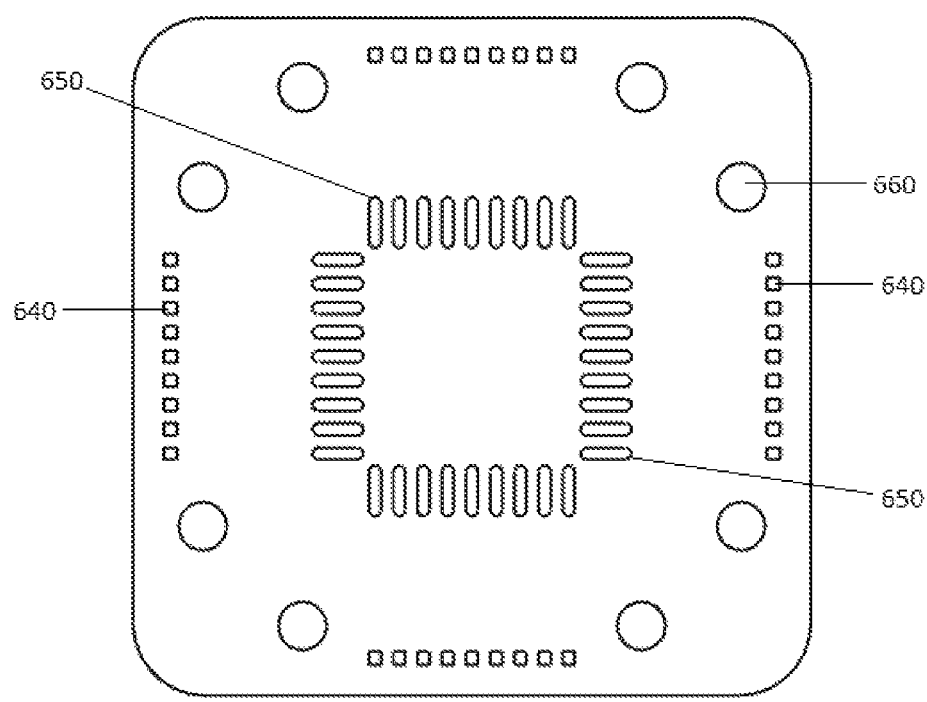
FIGS. 6a and 6b show views of a bottom cover in an embodiment of this invention
Figure 6B:
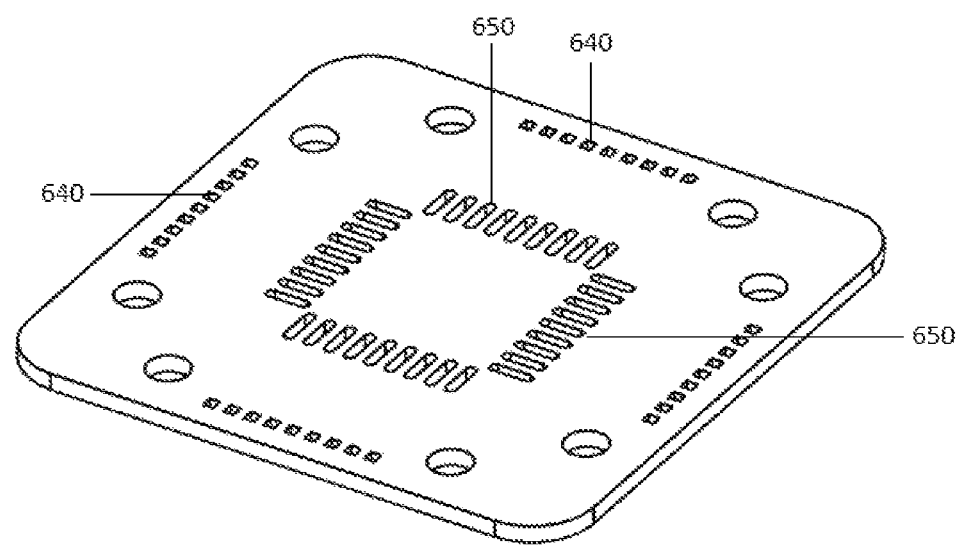

Referring to FIGS. 6a and 6b, there is shown a bottom cover (60). This bottom cover (60) is a square, plate-like member with rounded corners. It is constructed with a row of openings (640), each opening adapted to receive one said vertical lower insert (242) snugly. The bottom cover (60) is also provided with elongated openings (650) to allow the said lower tips (115, 215) of the front (10) and back (20) contacts to peek through.

Figure 7A:
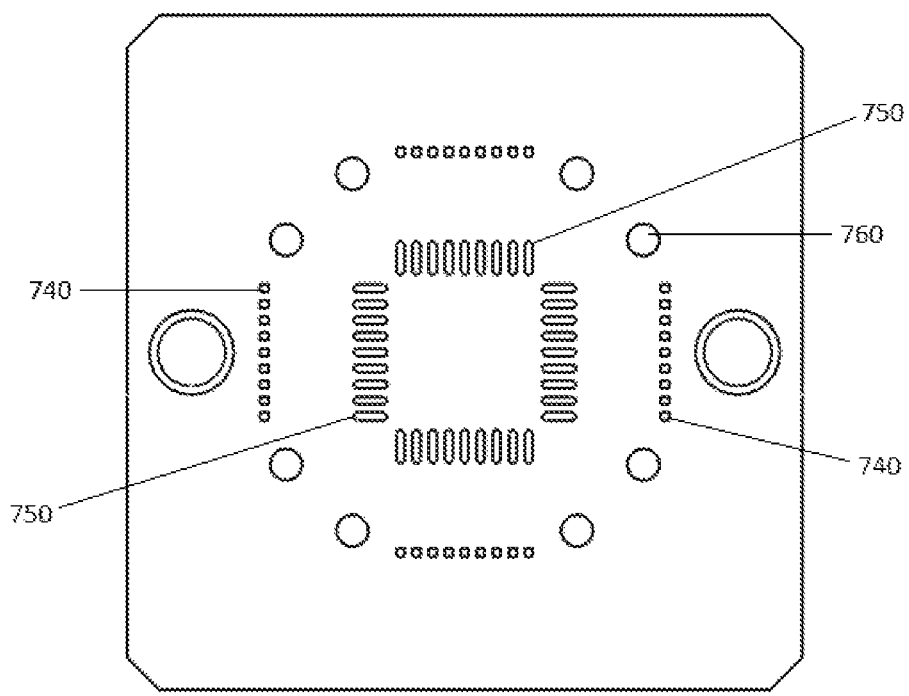
FIGS. 7a and 7b show views of a top cover in an embodiment of this invention
Figure 7B:
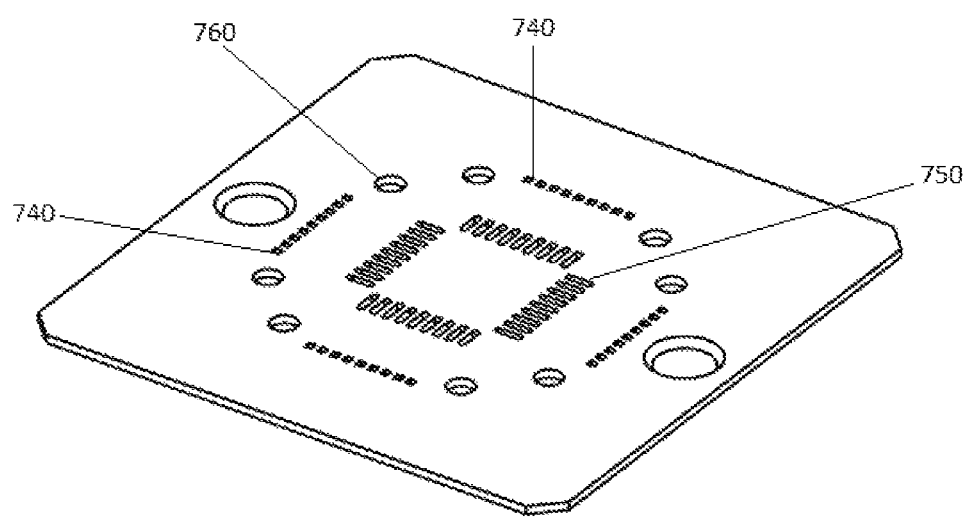

Referring to FIGS. 7a and 7b, there is shown a top cover (70). This top cover (70) is a square, plate-like member with rounded corners. It is constructed with a row of openings (740), each opening adapted to receive one said vertical upper insert (244) snugly. The top cover (70) is also provided with elongated openings (750) to allow the said upper tips (125, 225) of the front (10) and back (20) contacts to peek through.

Figure 8A:
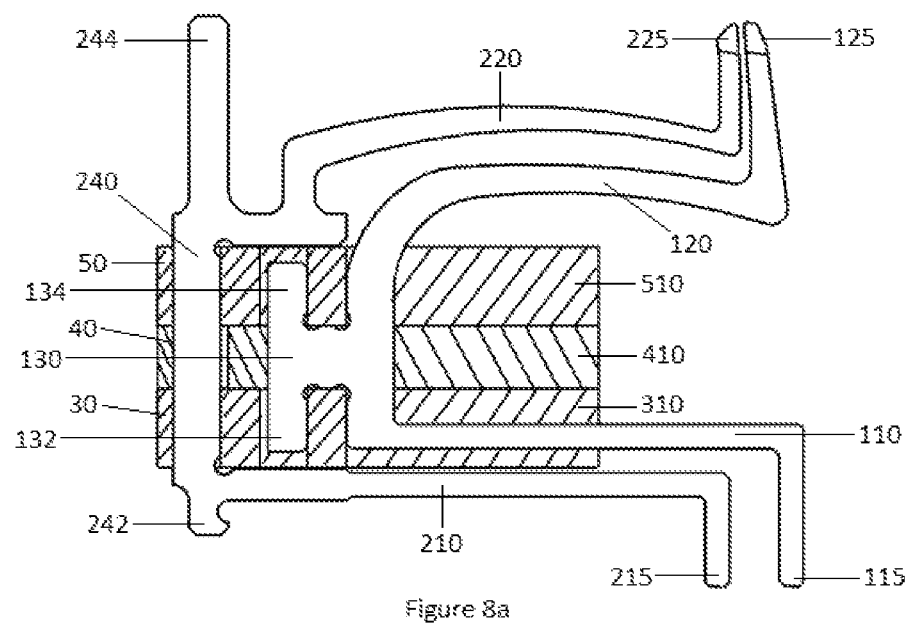
FIGS. 8a and 8b show views of a sub-assembly in an embodiment of this invention
Figure 8B:
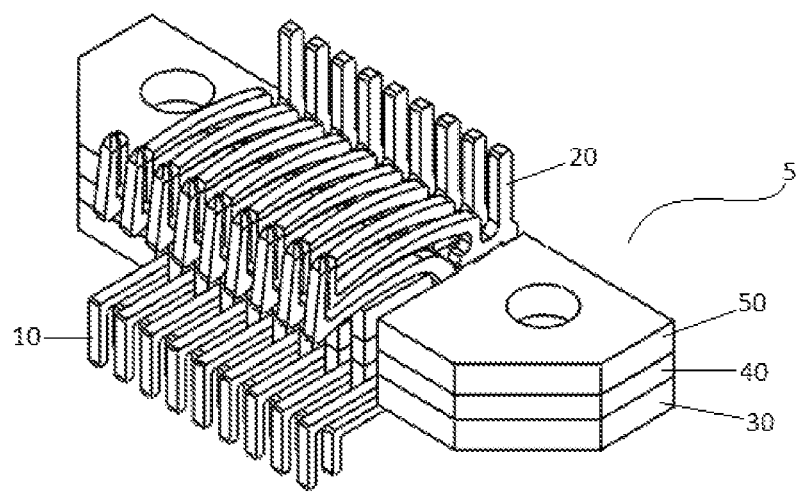

FIGS. 8a and 8b show views of a sub-assembly (5) in an embodiment of the present invention. In an electrical contact sub-assembly (5) for use in an integrated circuit testing apparatus, there is provided a plurality of front cantilever spring contacts (10), each front contact (10) having a lower arm (110) extending to a lower tip (115), an upper arm (120) extending to an upper tip (125), and a vertical back (140) connecting said lower and upper arms, a rear bracket (130) connected to said vertical back, said rear bracket having a vertical lower insert (132) and a vertical upper insert (134). There is also provided a plurality of back cantilever spring contacts (20), each back contact (20) having a lower arm (210) extending to a lower tip (215), an upper arm (220) extending to an upper tip (225), and a vertical back (240) having a vertical lower insert (242) and a vertical upper insert (244) extending from said vertical back (240) of said back contact (20).

Still referring to FIGS. 8a and 8b, there is also provided a plate-like base layer (30) having a plurality of front elongated protrusions (310) and back protrusions (320), said front elongated protrusions and back protrusions thus forming front and back slits, respectively, and a row of openings (330) on said base layer (30), each said opening (330) located between a corresponding said front and back slit, and each said opening (330) adapted to receive each said vertical lower insert (132) of said front contact (10) snugly. Each said front slit is adapted to receive said lower arm (110) of said front contact (10). There is also provided a plate-like separator layer (40) having a plurality of front elongated protrusions (410) and back protrusions (420), said front elongated protrusions and back protrusions thus forming front and back slits, respectively, and said front elongated (410) and back (420) protrusions aligned with and corresponding to said front elongated (310) and back (320) protrusions of said base layer (30). There is also provided a plate-like top layer (50) having a plurality of front elongated protrusions (510) and back protrusions (520), said front elongated protrusions and back protrusions thus forming front and back slits, respectively. There is provided a row of openings (530) on said top layer (50), each said opening (530) located between a corresponding said front and back slit. The front elongated (510) and back (520) protrusions are aligned with and correspond to said front elongated (310) and back (320) protrusions of said base layer (30). Each opening (530) is adapted to receive one vertical upper insert (134) of said front contact (10) snugly. Each said front slit is adapted to receive an upper arm (120) of said front contact (10).

Still referring to FIGS. 8a and 8b, each front contact (10) is assembled onto said base layer (30) by guiding each said vertical lower insert (132) into each said opening (330) of the base layer (30), with each lower arm (110) of the front contact (10) sliding into said front slits of the base layer (30), until a plurality of front contacts (10) is assembled in a row on the base layer (30). The separator (40) is then lowered on to the base layer (30), with the said front slits of the separator (40) sliding over the upper arms (120) of the front contacts (10) in order to continue downwards until the separator (40) sits flush on the base layer (30). The top layer (50) is the lowered on to the separator (40) by guiding each said opening (530) into each said corresponding vertical upper insert (134) of the front contact (10), until the top layer (50) sits flush on the separator (40). Thus, the row of front contacts (10) is locked in place. Finally, each back contact (20) is slid forwards from a rear side of the sub-assembly (5) so that each said vertical back (240) of the back contact (20) is received by a corresponding said back slit of the base layer (30), separator (40), and top (50) layer. In this way, each sub-assembly (5) is packed together with negligible movement and tolerances between each component.

Figure 9A:
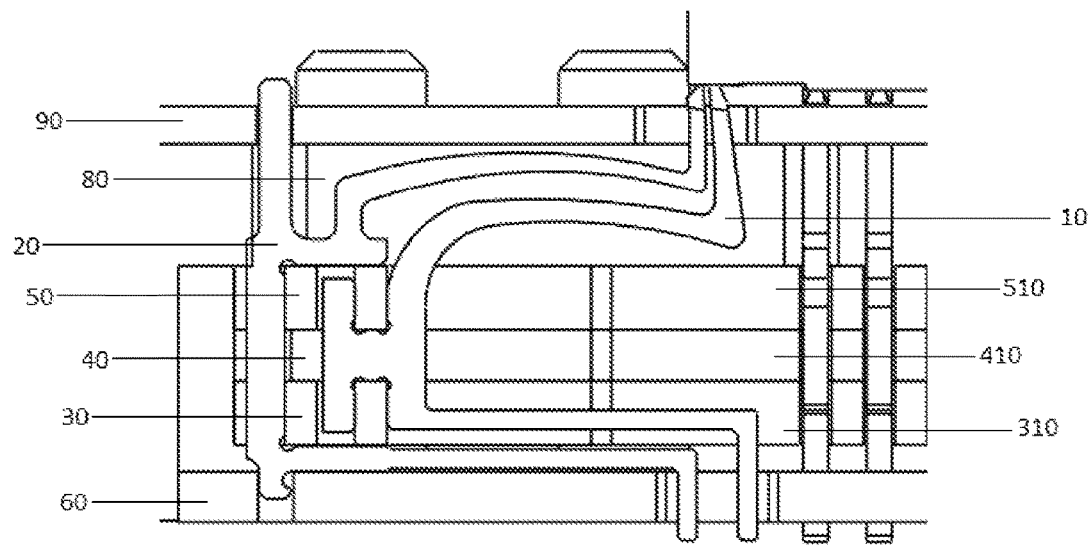
FIGS. 9a, 9b and 9c show views of an assembly in an embodiment of this invention
Figure 9B:
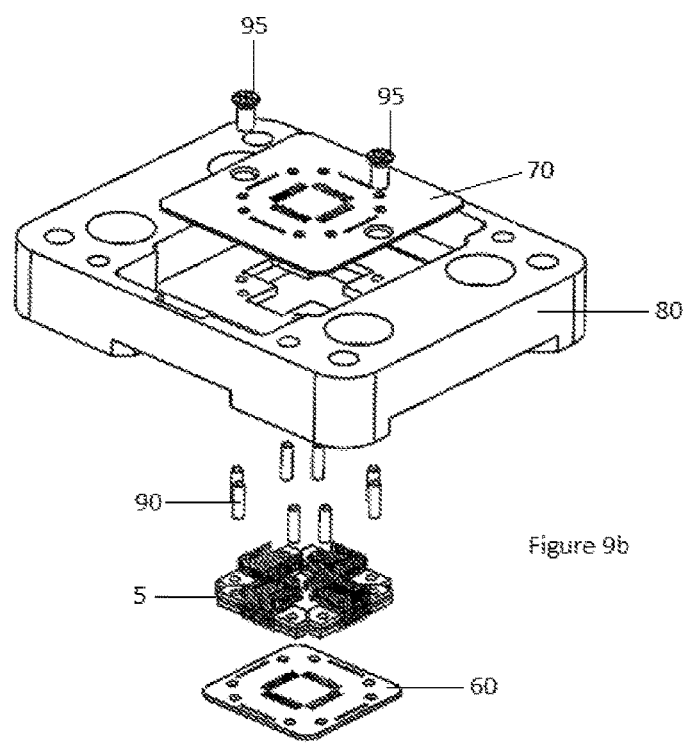
Figure 9C:
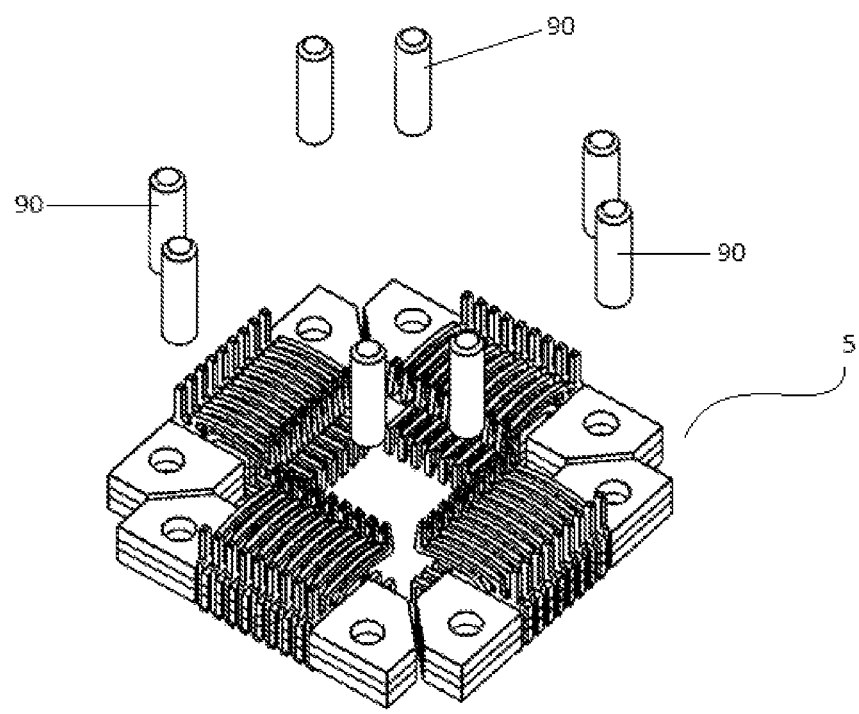

FIGS. 9a, 9b and 9c show views of a complete assembly in an embodiment of the present invention. Four sub-assemblies (5) described above and illustrated in FIGS. 8a and 8b are placed in a square formation, one sub-assembly (5) on each side, on a bottom cover (60). As described above and illustrated in FIGS. 6a and 6b, the bottom cover is constructed with a row of openings (640), each opening adapted to receive one said vertical lower insert (242) of the back contact (20) snugly. The said sub-assemblies (5) are attached to the bottom plate by carefully guiding the said rows of lower inserts (242) of the back contact (20) into the rows of openings (640). In this manner, the sub-assemblies (5) are aligned with the bottom cover (60). As mentioned above, the bottom cover (60) is also provided with elongated openings (650) to allow the said lower tips (115, 215) of the front (10) and back (20) contacts to peek through.

Still referring to FIGS. 9a, 9b and 9c, it can be seen that the bottom cover (60) attached to the four sub-assemblies (5) is then attached on the top side to a housing (80) and then the top cover (70). The top cover (70), like the bottom cover (60), is also constructed with a row of openings (740), each opening adapted to receive one said vertical upper insert (244) of the back contact (20) snugly. In this manner, when the bottom cover (60) and top cover (70) sandwich the sub-assemblies (5), these openings (640, 740) hold the lower (242) and upper (244) inserts snugly, and restrict lateral movement of the back contact (20).

Further, each sub-assembly (5) comprising of base layer (30), separator (40), and top layer (50) is provided with through holes near each end of their oblong shape. These through holes align with through holes located on the bottom cover (60), housing (80) and top cover (70). When all of these layers comprising the sub-assemblies (5), bottom cover (60), housing (80) and top cover (70) are aligned, dowel pins (90) are used to retard lateral movement between the layers. Once each of the sub-assemblies (5), bottom cover (60), housing (80) and top cover (70) are pressed close to each other, screws (95) are used to hold the top cover (70) to the housing (80).

In this way, each component is packed together with negligible movement and tolerances between each component. A very high accuracy between contact tip (115, 125, 215, 225) and contact pads of the device to be tested can be achieved with this design.

The said base layer (30), separator (40) and top layer (50) are constructed from an electrically non-conductive material, and the said front (10) and back (20) cantilever spring contacts are constructed from an electrically conductive material.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:

1. An electrical contact sub-assembly for use in an integrated circuit testing apparatus, comprising:
   a plurality of front cantilever spring contacts, each front contact having a lower arm, an upper arm and a vertical back connecting said lower and upper arms, a rear bracket connected to said vertical back, said rear bracket having a vertical lower insert and a vertical upper insert;

a plurality of back cantilever spring contacts, each back contact having a lower arm, an upper arm and a vertical back having a vertical lower insert and a vertical upper insert extending from said vertical back of said contact;

a base layer having a plurality of front elongated protrusions and back protrusions, said front elongated protrusions and back protrusions thus forming front and back slits, respectively, and a row of openings on said base layer, each said opening located between a corresponding said front and back slit, and each said opening adapted to receive each said vertical lower insert of said front contact snugly, and each said front slit adapted to receive said lower arm of said front contact;

a separator layer having a plurality of front elongated protrusions and back protrusions, said front elongated protrusions and back protrusions thus forming front and back slits, respectively, and said front elongated and back protrusions aligned with and corresponding to said front elongated and back protrusions of said base layer;

a top layer having a plurality of front elongated protrusions and back protrusions, said front elongated protrusions and back protrusions thus forming front and back slits, respectively, and a row of openings on said top layer, each said opening located between a corresponding said front and back slit, and said front elongated and back protrusions aligned with and corresponding to said front elongated and back protrusions of said base layer, each said opening adapted to receive each said vertical upper insert of said front contact snugly, and each said front slit adapted to receive said upper arm of said front contact;

whereby each said front contact is assembled onto said base layer by guiding each said vertical lower insert into each said opening so that a plurality of said front contacts is assembled in a row on said base layer, and the said separator is placed on top of said base layer, and the said top layer is placed on top of the said separator by guiding each said opening into each said corresponding vertical upper insert, thus locking the said row of front contacts in place, and sliding each said back contact from a rear side of the sub-assembly so that each said vertical back is received by a corresponding said back slit of the base layer, separator, and top layer.

2. An electrical contact sub-assembly for use in an integrated circuit testing apparatus in accordance with claim 1, wherein the upper arm extends from a point on said vertical back forwards along a horizontal member until a point, where it deviates 90° upwards, and wherein the horizontal member is substantially horizontal, such that the horizontal member, vertical back and a rear portion of the lower arm form a C shape with 90° angles which, via a plurality of these back contacts, is used to lock and hold together a sub-assembly of the front contact, base layer, separator and top layer.

3. An electrical contact sub-assembly for use in an integrated circuit testing apparatus in accordance with claim 1, wherein the upper arm of the front contact is arced in such a way as to minimize a wiping stroke between the upper tip and a IC pad to be tested.

4. An electrical contact sub-assembly for use in an integrated circuit testing apparatus in accordance with claim 2, wherein the upper arm of the back contact is arced in such a way as to minimize a wiping stroke between the upper tip and a IC pad to be tested.

5. An electrical contact sub-assembly for use in an integrated circuit testing apparatus in accordance with claim 1, wherein the said base layer, separator and top layer each is provided with a pair of openings, one near each end, and each opening aligned across the three said layers.

6. An electrical contact sub-assembly for use in an integrated circuit testing apparatus in accordance with claim 1, wherein the said base layer, separator and top layer are constructed from an electrically non-conductive material, and the said front and back cantilever spring contacts are constructed from an electrically conductive material.

7. An electrical contact assembly for use in an integrated circuit testing apparatus, comprising:
   a plurality of front cantilever spring contacts, each front contact having a lower arm, an upper arm and a vertical back connecting said lower and upper arms, a rear bracket connected to said vertical back, said rear bracket having a vertical lower insert and a vertical upper insert;
   a plurality of back cantilever spring contacts, each back contact having a lower arm, an upper arm and a vertical back having a vertical lower insert and a vertical upper insert extending from said vertical back of said contact;
   four base layers, each having a plurality of front elongated protrusions and back protrusions, said front elongated protrusions and back protrusions thus forming front and back slits, respectively, and a row of openings on said base layer, each said opening located between a corresponding said front and back slit, and each said opening adapted to receive each said vertical lower insert of said front cantilever spring contact snugly, and each said front slit adapted to receive said lower arm of said front cantilever contact, each said base layer is provided with a pair of through holes, one near each end;
   four separator layers, each having a plurality of front elongated protrusions and back protrusions, said front elongated protrusions and back protrusions thus forming front and back slits, respectively, and said front elongated and back protrusions aligned with and corresponding to said front elongated and back protrusions of said base layer, each said separator is provided with a pair of through holes, one near each end, and aligned with said through holes on the base layer;
   four top layers, each having a plurality of front elongated protrusions and back protrusions, said front elongated protrusions and back protrusions thus forming front and back slits, respectively, and a row of openings on said top layer, each said opening located between a corresponding said front and back slit, and said front elongated and back protrusions aligned with and corresponding to said front elongated and back protrusions of said base layer, each said opening adapted to receive each said vertical upper insert of said front cantilever spring contact matchingly, and each said front slit adapted to receive said upper arm of said front cantilever contact matchingly, each said top layer is provided with a pair of through holes, one near each end, and aligned with said through holes on the base layer;
   a bottom cover having through holes that align with said pair of through holes on said bottom layers, separators and top layers, and a plurality of openings each adapted to receive one said vertical lower insert of the back contact, and a plurality of openings to allow said lower arm of front contact and lower arm of back contact to peek through;
   a top cover having through holes that align with said pair of through holes on said bottom layers, separators and top layers, and a plurality of openings each adapted to receive one said vertical upper insert of the back contact, and a plurality of openings to allow said upper arm of front contact and upper arm of back contact to peek through;

a housing adapted to receive said bottom cover, base layers, separators, top layers, and top cover;

a plurality of dowel pins for inserting through said through holes of said bottom cover, base layers, separators, top layers, and top cover, so that they are aligned with each other whereby each said front contact is assembled onto each said base layer by guiding each said vertical lower insert into each said opening so that a plurality of said front cantilever spring contacts or assembled in a row on said base layer, and each said separator is placed on top of said base layer, and each said top layer is placed on top of the said separator by guiding each said opening into each said corresponding vertical upper insert, thus locking the said row of front contacts in place, sliding each said back contact from a rear side of the sub-assembly so that each said vertical back is received by a corresponding said back slit of the base layer, separator, and top layer, thus forming a sub-assembly, and four of these said sub-assemblies are placed to form a square pattern on said bottom cover, said housing is placed above said bottom cover and sub-assemblies, said top cover is placed above said housing with said dowel pins inserted into said through holes to secure the sub-assemblies in alignment.

8. An electrical contact sub-assembly for use in an integrated circuit testing apparatus in accordance with claim 7, wherein the upper arm extends from a point on said vertical back forwards along a horizontal member until a point, where it deviates 90° upwards, and wherein the horizontal member is substantially horizontal, such that the horizontal member, vertical back and a rear portion of the lower arm form a C shape with 90° angles which, via a plurality of these back contacts, is used to lock and hold together a sub-assembly of the front contact, base layer, separator and top layer.

9. An electrical contact assembly for use in an integrated circuit testing apparatus in accordance with claim 7, wherein the said base layer, separator and top layer are constructed from an electrically non-conductive material, and the said front and back cantilever spring contacts are constructed from an electrically conductive material.

10. An electrical contact assembly for use in an integrated circuit testing apparatus in accordance with claim 7, wherein the said upper arm of the front contact extends to an almost vertical upper tip, said upper tip at an angle of between 7° and 8° to the vertical.

* * * * *